United States Patent
Mast

(10) Patent No.: US 7,152,483 B2
(45) Date of Patent: Dec. 26, 2006

(54) HIGH PRESSURE SENSOR COMPRISING SILICON MEMBRANE AND SOLDER LAYER

(75) Inventor: Martin Mast, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 110 days.

(21) Appl. No.: 10/480,492

(22) PCT Filed: May 7, 2003

(86) PCT No.: PCT/DE03/01463

§ 371 (c)(1),
(2), (4) Date: May 27, 2004

(87) PCT Pub. No.: WO04/001358

PCT Pub. Date: Dec. 31, 2003

(65) Prior Publication Data

US 2004/0200286 A1    Oct. 14, 2004

(30) Foreign Application Priority Data

Jun. 22, 2002  (DE) .................... 102 28 000

(51) Int. Cl.
*G01L 9/00* (2006.01)
(52) U.S. Cl. .............................. 73/754
(58) Field of Classification Search ............ 73/754
See application file for complete search history.

(56) References Cited

U.S. PATENT DOCUMENTS

| | | | | |
|---|---|---|---|---|
| 4,680,569 A | * | 7/1987 | Yamaki et al. ............ 338/42 |
| 4,809,555 A | * | 3/1989 | Kunz ......................... 73/727 |
| 4,918,992 A | | 4/1990 | Mathias |
| 4,930,353 A | * | 6/1990 | Kato et al. ................. 73/727 |
| 4,939,497 A | * | 7/1990 | Nishida et al. ............... 338/4 |
| 6,070,469 A | * | 6/2000 | Taniguchi et al. .......... 73/720 |
| 6,351,996 B1 | * | 3/2002 | Nasiri et al. ............... 73/706 |
| 6,550,337 B1 | * | 4/2003 | Wagner et al. .............. 73/715 |
| 2002/0073533 A1 | | 6/2002 | Kavlico | |

FOREIGN PATENT DOCUMENTS

| | | |
|---|---|---|
| DE | 2630640 | 1/1977 |
| DE | 34 36 440 | 4/1986 |
| DE | 197 31 420 | 1/1999 |
| DE | 100 14 992 | 10/2001 |
| EP | 0 317 664 | 5/1989 |
| EP | 0 936 455 | 8/1999 |
| EP | 0 949 494 | 10/1999 |

\* cited by examiner

*Primary Examiner*—Max Noori
(74) *Attorney, Agent, or Firm*—Kenyon & Kenyon LLP

(57) ABSTRACT

A device for measuring pressure, e.g., for measuring high pressure, including a pressure transducer that is arranged in a housing and includes sensor elements and a sensor diaphragm on a first side, and on a second side opposite the first side is provided with a cutout that extends from the second side to the sensor diaphragm. The pressure transducer is formed as a semiconductor pressure transducer and, with an edge area of the second side surrounding the cutout, is directly soldered onto a support part, provided with a first pressure-channel section, with the aid of a solder layer in such a manner that the first pressure-channel section and the cutout are interconnected.

14 Claims, 4 Drawing Sheets

HIGH PRESSURE SENSOR COMPRISING SILICON MEMBRANE AND SOLDER LAYER

FIELD OF THE INVENTION

The present invention relates to a device for measuring pressure.

BACKGROUND INFORMATION

A device for measuring pressure is described in, for example, German Published Patent Application No. 100 14 992. This high-pressure sensor uses a metal pressure-measuring cell, provided with a recess, as a pressure transducer. Sensor elements and a measuring diaphragm are formed on one side of the metallic pressure-measuring cell. With the opposite second side, the pressure-measuring cell is welded onto a connection piece of the sensor device. An evaluation circuit is arranged on a separate printed circuit board or a hybrid, and is electrically connected to the sensor elements on the upper side of the pressure-measuring cell. High pressures above 140 bar may also be measured using such a device.

Furthermore, in German Published Patent Application No. 197 31 420, for instance, a device is described for measuring pressure including a silicon chip as a semiconductor pressure transducer which is provided with sensor elements and an evaluation circuit on its upper side and is mounted on a glass base. However, such pressure sensors are only used for measuring relatively small pressures below 70 bar, since the mechanical stresses acting at greater pressures lead to fractures in the glass or silicon chip.

SUMMARY

An embodiment of a device according to the present invention for measuring pressure may allow use of a pressure transducer including a semiconductor chip, on whose upper side are formed sensor elements and, for example, additionally, an evaluation circuit as an integrated circuit, for measuring high pressure above 70 bar. The degree of complexity pursued in other systems for insulating the sensor elements from the metallic pressure-measuring cell in the case of conventional high-pressure sensors may be avoided. By combining the evaluation circuit and sensor elements on the semiconductor chip, a high degree of integration of the device may be achieved. In this context, by directly soldering the semiconductor chip, using an edge area surrounding a cutout in the semiconductor chip, onto a support part provided with a first pressure-channel section, the first pressure-channel section and the cutout being interconnected, a connection resistant to high pressure may be produced between the semiconductor chip and the support part.

The pressure transducer may be formed in one piece from a semiconductor material such as silicon. A stack assembly may be used that includes a first semiconductor structure, provided with the sensor diaphragm and the sensor elements, and a second semiconductor structure fixedly joined thereto via a connection zone and soldered onto the support part. The second semiconductor structure largely prevents thermomechanical stress loads from reaching and damaging the sensor elements. The reliability and service life of the device is thereby increased. The first semiconductor structure and the second semiconductor structure may be made of silicon. The connection zone may be made of a eutectic zone of gold and silicon.

To prevent thermal stresses between the semiconductor chip and the support part, the solder layer has a lower thermal expansion coefficient than tin-lead solder, which is better adapted to the semiconductor material. For example, the use of AuSn20-solder may be advantageous.

The support part has a thermal expansion coefficient adapted to the semiconductor material of the pressure transducer. The support part may be made of a metal alloy, for example, of iron-nickel (Invar®) or iron-nickel-cobalt (Kovar®).

The cutout in the semiconductor pressure transducer may be formed by reactive ion etching (trench etching) on the pressure transducer. In this manner, sharp transitions and bends in the semiconductor pressure transducer, at which stresses form in response to high pressure loads which lead to the formation of fractures, are avoided.

The device may include a sensor housing; and affixed as a separate component to an outer side of a first sensor-housing part of the sensor housing that is provided with a through hole is a connection piece covering the through hole, and the support part positioned in the sensor housing is connected to the connection piece through the through hole, for example, by laser welding, since thermomechanical stresses between the connection piece and the support part may thereby be considerably reduced.

Because on a side of the connection piece facing the through hole, a circumferential collar is formed which is disposed around a second pressure-channel section formed in the connection piece, and because the support part, on its side facing the connection piece, includes a connector which engages with the collar and in which the first pressure-channel section runs, thermomechanical stresses between the connection piece and the support part may be even further reduced. In this connection, the connector may have an outside diameter which is perceptibly smaller than the outside diameter of the support part, so that only a small interconnection region of the support part and the connection piece exists.

In an another exemplary embodiment, the pressure transducer, the support part and a cover part placed on the support part may be formed as a pressure-transducer module, the cover part and the support part forming a closed module housing containing the pressure transducer, and a connector being attached to the support part or being integrally joined with it, in which the first pressure-channel section runs. The modular configuration may provide that when calibrating the pressure transducer, pressure-sensor modules sorted out as non-functional may be sorted out prior to installation into the actual sensor housing.

DETAILED DESCRIPTION

Figure 1:
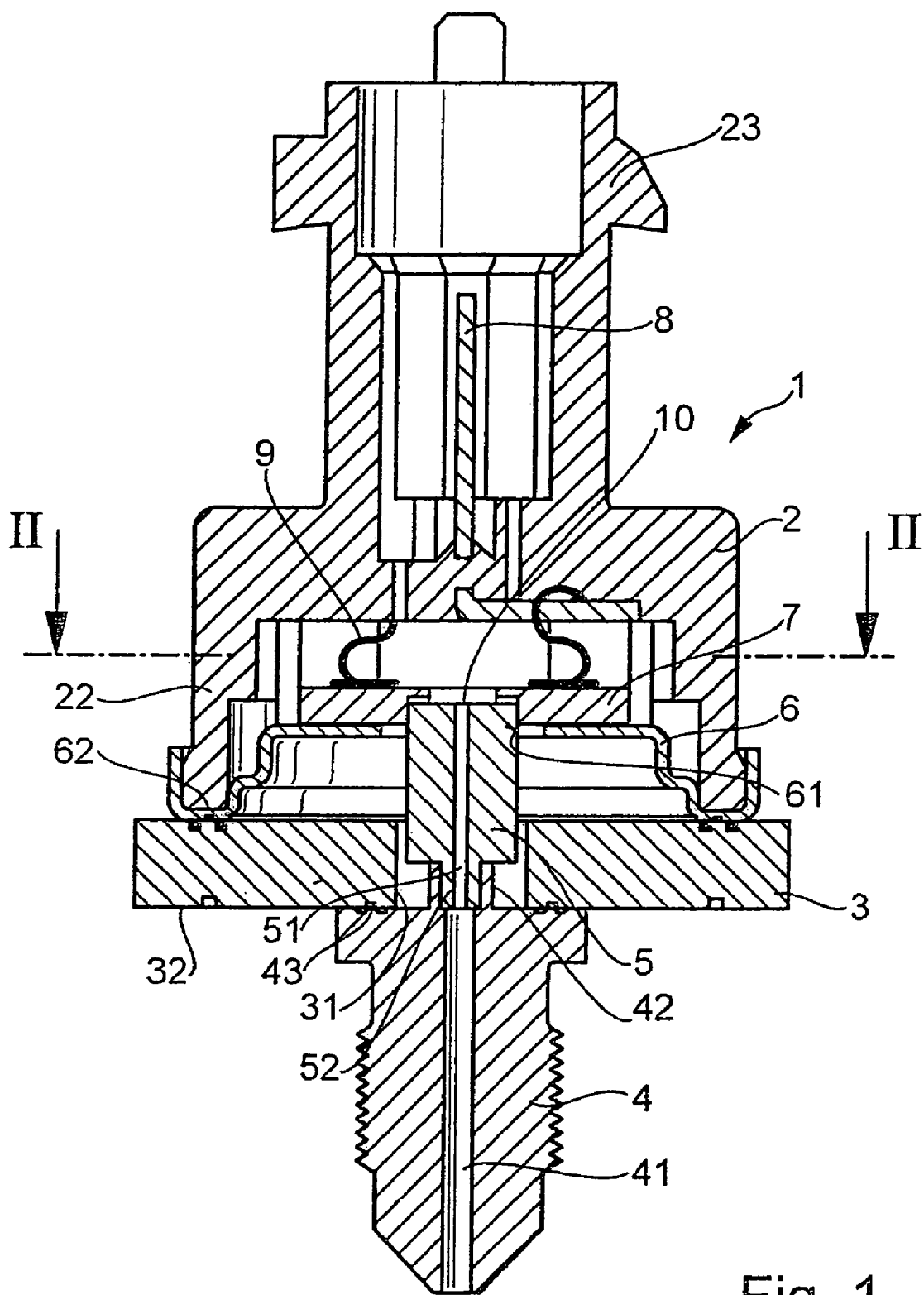
FIG. 1 shows a cross-section through a first exemplary embodiment of the present invention.
Figure 2:
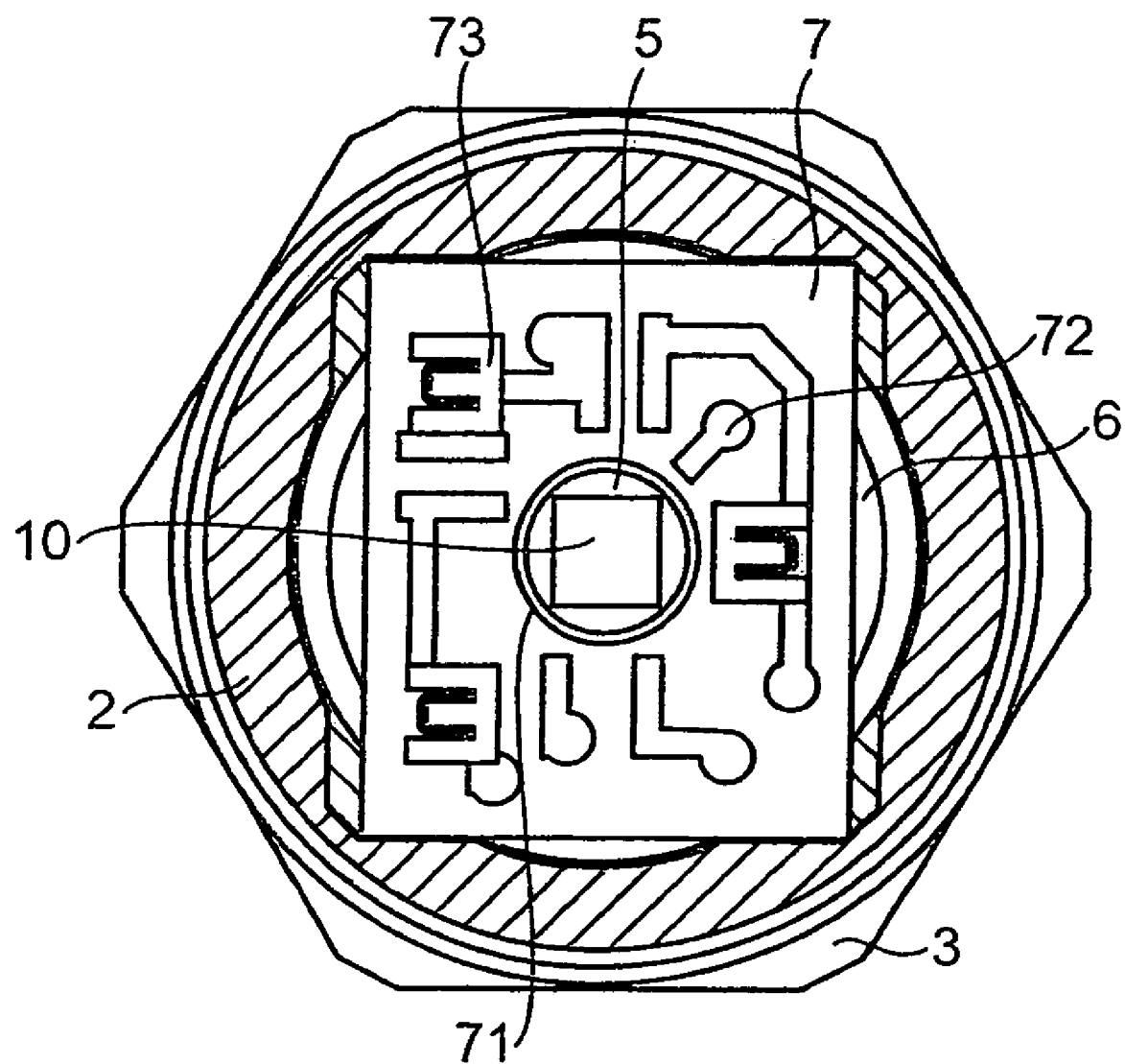
FIG. 2 shows a cross-section through the exemplary embodiment from FIG. 1 along the line II—II in FIG. 1.
Figure 3:
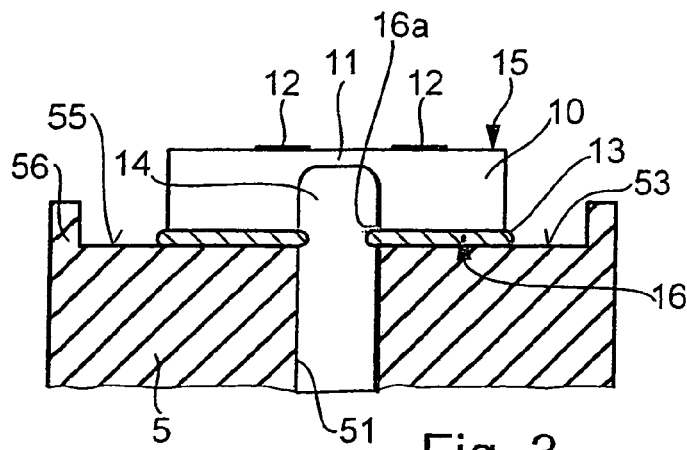
FIG. 3 shows an enlarged detail from FIG. 1.

FIGS. 1 and 2 show a first exemplary embodiment of the device according to the present invention for measuring pressure. A semiconductor pressure transducer 10 is soldered onto a pedestal-type support part 5. An enlarged detail view of the semiconductor pressure transducer soldered onto pedestal 5 is shown in FIG. 3. Semiconductor pressure transducer 10 may be formed as a silicon chip and may be provided with sensor elements 12 on upper side 15. A central section on the upper side which stretches over a cutout 14 introduced into the lower side is used as sensor diaphragm 11, sensor elements 12 sensing deformations of thin sensor diaphragm 11 resulting from a compressive load of the same. In addition to sensor elements 12, an evaluation circuit may also be arranged on upper side 15 of semiconductor pressure transducer 10 around sensor diaphragm 11. Cutout 14 may be introduced into the pressure transducer by reactive ion etching (trench etching), which means gentle transitions develop on the inner wall of cutout 14 and sharp edges are avoided at which fractures could form in response to high compressive loads. The semiconductor pressure transducer, using an edge area 16a of lower side 16 surrounding cutout 14, is soldered directly onto upper side 55 of support part 5. Upper side 55 is surrounded by a circumferential collar 56 for centering pressure transducer 10.

To reduce thermal stresses between semiconductor pressure transducer 10 and support part 5, support part 5 is produced from a material adapted to the expansion coefficient of silicon, and may be produced from an iron-nickel alloy (Invar®) or an iron-nickel-cobalt alloy (Kovar®). Solder layer 13 between semiconductor pressure transducer 10 and support part 5 has a very small expansion coefficient that may be markedly less than the expansion coefficient of conventional tin-lead solder. The use of AuSn20-solder may be advantageous. As FIG. 3 shows, cutout 14 is connected to a first pressure-channel section 51 disposed in support part 5, so that the lower side of sensor diaphragm 11 facing cutout 14 is able to be acted upon by pressure via first pressure-channel section 51.

In another exemplary embodiment, semiconductor pressure transducer 10 includes a first semiconductor structure 17, on whose upper side 15 sensor elements 12 are positioned, and which, on its side facing away from sensor elements 12, is joined to a second semiconductor structure 19. Both semiconductor structures may be formed of silicon, connection zone 18 of the two semiconductor structures may include a eutectic zone of gold and silicon. Second semiconductor structure 19, with its side 16 facing away from first semiconductor structure 17, is soldered onto support part 5. In this exemplary embodiment, the second semiconductor structure acts as a protective layer for the first semiconductor structure. Thermomechanical loads are initially transferred from the support part only to the second semiconductor structure. Sensor elements 12 and sensor diaphragm 11 are thereby protected.

As FIG. 1 further shows, pedestal-like support part 5, with its side facing away from semiconductor pressure transducer 10, is joined by laser welding to a metallic connection piece 4 made, for example, of high-grade steel. Connection piece 4 is formed as a screw terminal and is welded as a separate component onto outer side 32 of a metallic first sensor-housing part 3, so that connection piece 4 covers a central through hole 31 in first sensor-housing part 3. The circumferential wall of first sensor-housing part 3 forms a hexagon head, as may be seen in FIG. 2.

The somewhat cylindrical support part 5 has a smaller diameter than through hole 31. On a side of support part 5 facing away from semiconductor pressure transducer 10, a connector 52 is formed in which first pressure-channel section 51 is centrically set in. Connection piece 4, on its side facing through hole 31, includes a circumferential collar 42 which, on this side, is arranged so that it encircles a second pressure-channel section 41 disposed in connection piece 4. Support part 5 is inserted with connector 52 into collar 42 and welded to it. Subsequently, support part 5 may be pushed through through hole 31 of first sensor-housing part 3, and the connection piece may be welded to outer side 32 of first sensor-housing part 3 in region 43. In operation, the pressure is fed from second pressure-channel section 41 into first pressure-channel section 51, and from there into cutout 14 on the lower side of the semiconductor pressure transducer.

In the exemplary embodiment shown here, a punched bent component 6 is also provided which is welded onto the side of first sensor-housing part 3 facing away from outer side 32. Punched bent component 6 includes an opening 61 through which support part 5 is guided. On the side of punched bent component 6 facing away from first sensor-housing part 3, a printed circuit board 7 or a hybrid or corresponding part is mounted which includes a cutout 71 through which support part 5 is led. Semiconductor pressure transducer 10 is connected to printed circuit traces 72 on printed circuit board 7 via bonding wires. Terminal pads 73 of printed circuit board 7 are connected via contact-spring elements 9 to electrical connector elements 8 which are arranged in a second sensor-housing part 2 formed, for instance, of plastic, that is placed on punched bent component 6. In the exemplary embodiment shown in FIG. 1, punched bent component 6 is bent in such a manner that the upper side, provided with the printed circuit traces, of the printed circuit board placed on the punched bent component is positioned, e.g., flush with the upper side of pressure transducer 10. Connector elements 8 are led from a plug 23 into the interior of sensor housing 1. The outer region of the punched bent component includes a grooved contour 62 with which a cylindrical wall 22 of second sensor-housing part 2 engages. Second sensor-housing part 2 is sealed against punched bent component 6 via a sealing adhesive in contour 62. First sensor-housing part 3, second sensor-housing part 2, punched bent component 6 arranged in between and connection piece 4 form a closed sensor housing 1 in which support part 5 and pressure transducer 10 are arranged.

Second sensor-housing part 2 may also be joined directly to first sensor-housing part 3, and punched bent component 6 may be omitted. Moreover, opening 61 in punched bent component 6 may be enlarged and the punched bent component may have a ring shape, and printed circuit board 7 may be placed on first sensor-housing part 3 so that the printed circuit board reaches through the enlarged opening in the punched bent component.

Figure 4:
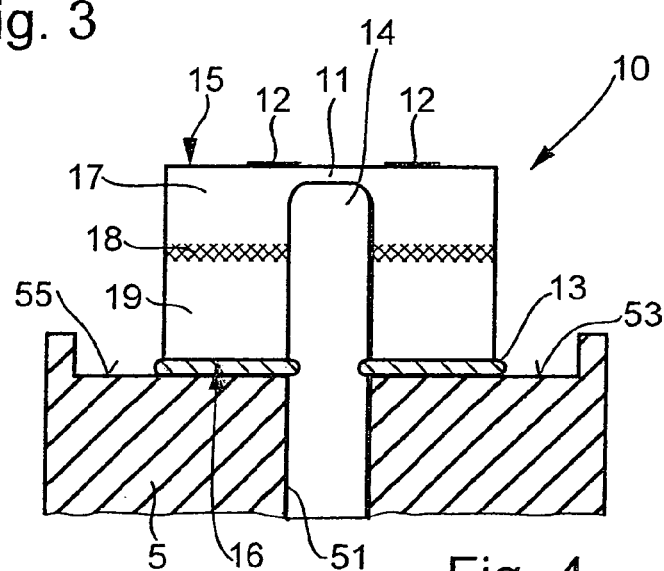
FIG. 4 shows an enlarged detail for a second exemplary embodiment.
Figure 5:
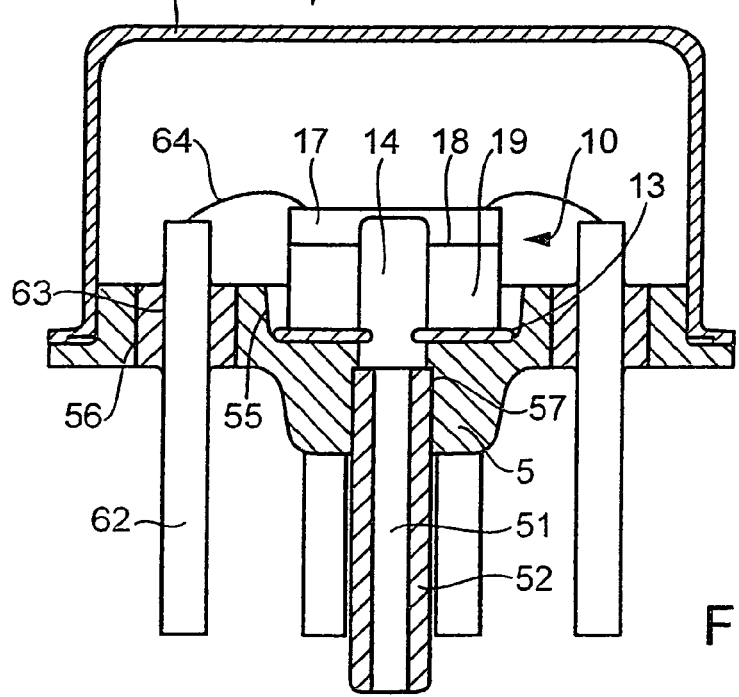
FIG. 5 shows a third exemplary embodiment of the present invention formed as a pressure-sensor module.

FIG. 5 shows a further exemplary embodiment of the device for measuring pressure. In this exemplary embodiment, metallic support part 5 forms the bottom of a module housing in which semiconductor pressure transducer 10 is arranged. Here, analogous to the exemplary embodiment from FIG. 4, semiconductor pressure transducer 10 is made up of two semiconductor structures and, with second semiconductor structure 19 in a depression 55, is soldered onto support part 5. Pin-shaped electrical contact elements 62 are sealed in glass lead-throughs 63 that are disposed in through holes 56 of support part 5. Arranged in a centrical opening 57 of support part 5 is a tubular cylindrical connector 52 in which first pressure-channel section 51 runs. However, connector 52 may also be formed in one piece with the support part. Pressure transducer 10 is contacted via bonding wires 64 to pin-shaped contact elements 62. A cover part 61 placed on support part 5 forms, together with support part 5, a closed module housing 66. A reference pressure volume (e.g., vacuum) may be trapped between cover part 61 and support part 5, so that pressure transducer 10 measures a reference pressure.

Figure 6:
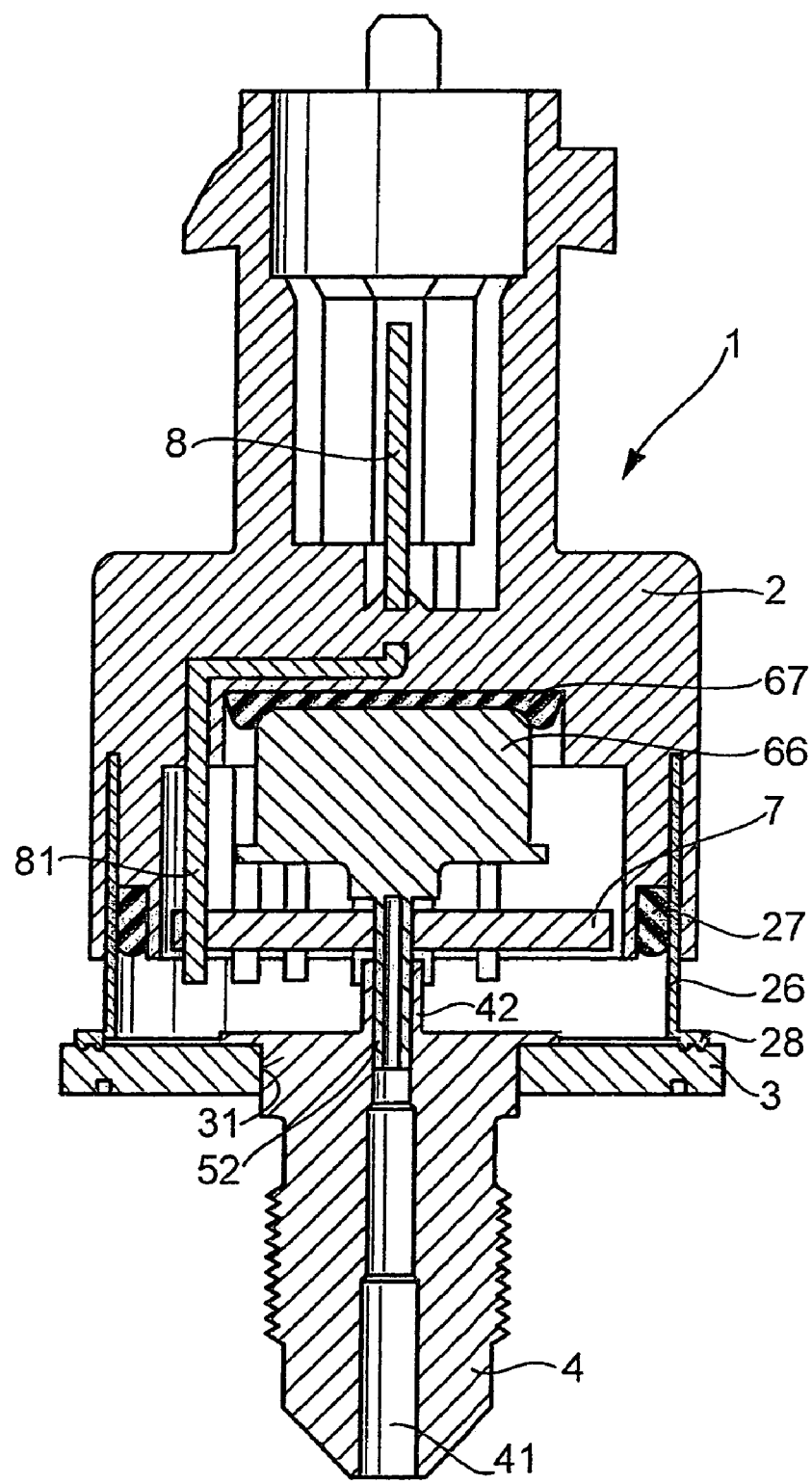
FIG. 6 shows a pressure sensor including a pressure-sensor module from FIG. 5 disposed therein.

Pressure-transducer module 66 shown in FIG. 5 may, as shown in FIG. 6, be installed in a sensor housing 1. In this context, pressure-transducer module 66 is placed on a printed circuit board 7. Electrical contact elements 62 are joined to the printed circuit traces of printed circuit board 7 by soldering, for example, while connector 52 is passed through an opening in the printed circuit board and inserted into a collar 42 of a connection piece 4 of sensor housing 1 and, as in the exemplary embodiment of FIG. 1, welded to it. Connection piece 4 is positioned on a first sensor-housing part 3. A second plastic sensor-housing part 2 is joined to an approximately cylindrical metal sleeve 26 whose end projecting from second sensor-housing part 2 includes a bent-over edge 28 that is welded to first sensor-housing part 3. A sealing adhesive agent 27 seals the interconnection region of metal sleeve 26 and first sensor-housing part 2. Electrical connector elements 8 are led through second sensor-housing part 2 into the interior of sensor housing 1 and electrically connected to printed circuit board 7. An adhesive agent 67 joins cover part 61 of pressure-sensor module 66 to the inner side of second sensor-housing part 2.

What is claimed is:

1. A device for measuring pressure, comprising:
   a pressure transducer arranged in a housing, a first side of the pressure transducer including sensor elements and a sensor diaphragm, a second side of the pressure transducer, opposite the first side, having a cutout that extends from the second side up to the sensor diaphragm;
   a sensor housing including an outer side of a first season-housing part with a through hole affixed to a connection piece covering the through hole; and
   wherein the support part is arranged in the sensor housing and is connected to the connection piece through the through hole, wherein the pressure transducer is a semiconductor pressure transducer and, via an edge area of the second side surrounding the cutout, is soldered directly onto a support part, the support part including a first pressure-channel section, via a solder layer such that the first pressure-channel section and the cutout are interconnected.

2. The device of claim 1, wherein the pressure transducer is formed in one piece from a semiconductor material.

3. The device of claim 1, wherein the pressure transducer includes a stack assembly having a first semiconductor structure including the sensor diaphragm and the sensor elements, and a second semiconductor structure fixedly joined thereto via a connection zone and soldered onto the support part.

4. The device of claim 3, wherein the first semiconductor structure and the second semiconductor structure include silicon, and the connection zone includes a eutectic zone including gold and silicon.

5. The device of claim 2, wherein the solder layer has a lower thermal expansion coefficient than tin-lead solder.

6. The device of claim 2, wherein the support part has a thermal expansion coefficient adapted to the semiconductor material.

7. The device of claim 5, wherein the solder layer includes AuSn20.

8. The device of claim 6, wherein the support part includes material adapted to an expansion coefficient of silicon.

9. The device of claim 8, wherein the support part includes one of an iron-nickel alloy and an iron-nickel-cobalt alloy.

10. The device of claim 1, wherein the cutout is formed by reactive ion etching on the pressure transducer.

11. The device of claim 1, wherein the pressure transducer, the support part and a cover part placed on the support part are formed as a pressure-transducer module, the cover part and the support part forming a closed module housing including the pressure transducer, and a connector in which the first pressure-channel section extends being one of secured to the support part and integrally joined with the support part.

12. The device of claim 1, wherein the support part is welded to the connection piece.

13. The device of claim 1, wherein on a side of the connection piece facing the through hole, a circumferential collar is positioned around a second pressure-channel section formed in the connection piece; and the support part, on its side facing the connection piece, includes a connector that engages with the circumferential collar and in which the first pressure-channel section extends.

14. The device of claim 13, wherein the connector has an outside diameter that is substantially smaller than the outside diameter of the support part.

* * * * *